United States Patent [19]
Fujii

[11] Patent Number: 5,572,149
[45] Date of Patent: Nov. 5, 1996

[54] CLOCK REGENERATION CIRCUIT

[75] Inventor: Haruhiko Fujii, Tokyo, Japan

[73] Assignee: Ando Electric Co., Ltd., Tokyo, Japan

[21] Appl. No.: 584,945

[22] Filed: Jan. 16, 1996

[30] Foreign Application Priority Data

Jan. 17, 1995 [JP] Japan ................................. 7-022210

[51] Int. Cl.$^6$ ................................................... H03K 19/00
[52] U.S. Cl. ............................ 326/93; 327/166; 327/291
[58] Field of Search ................................ 326/93; 327/164, 327/165, 166, 198, 199, 202, 217, 291

[56] References Cited

U.S. PATENT DOCUMENTS

| | | | |
|---|---|---|---|
| 4,972,161 | 11/1990 | Davies | 327/166 |
| 5,059,818 | 10/1991 | Witt | 327/291 |
| 5,418,822 | 5/1995 | Schlachter et al. | 327/291 |

*Primary Examiner*—Edward P. Westin
*Assistant Examiner*—Andrew Sanders
*Attorney, Agent, or Firm*—Flynn, Thiel, Boutell & Tanis, P.C.

[57] ABSTRACT

A clock regeneration circuit capable of obtaining clocks each having an arbitrary duty. The clock regeneration circuit comprises a first D-type flip-flop having a clock terminal for receiving an input clock signal from an input terminal, and a data input terminal for receiving data of an H level, a second D-type flip-flop having a clock terminal for receiving the input clock signal from the input terminal, and a data input terminal for receiving data of an H level, a first delay circuit which receives an output from an output terminal of the first D-type flip-flop and outputs an output thereof to the reset terminal of the first D-type flip-flop, and a second delay circuit which receives the output from an output terminal of the first D-type flip-flop and outputs an output to a reset terminal of the second D-type flip-flop, wherein an output clock signal is outputted from an output terminal of the second D-type flip-flop to an output terminal.

2 Claims, 3 Drawing Sheets

FIG. 3
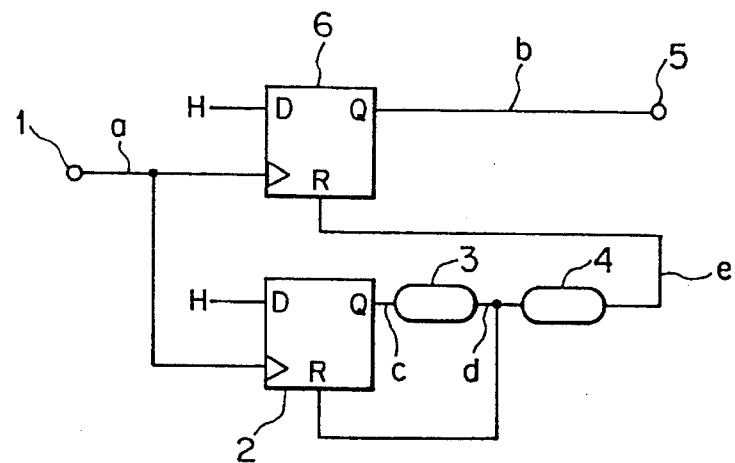
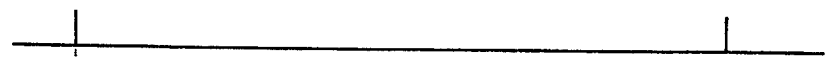
FIG. 4(a)
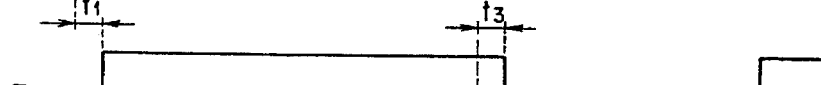
FIG. 4(b)
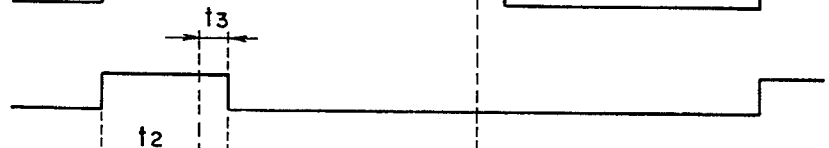
FIG. 4(c)
FIG. 4(d)
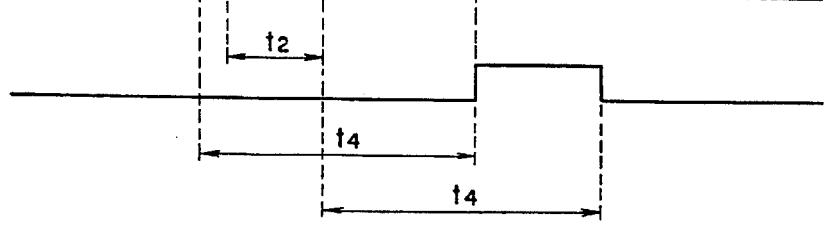
FIG. 4(e)

FIG. 5
PRIOR ART
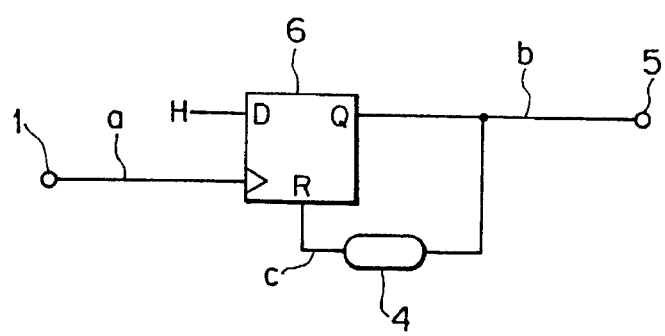
FIG. 6(a)
PRIOR ART
FIG. 6(b)
PRIOR ART
FIG. 6(c)
PRIOR ART

CLOCK REGENERATION CIRCUIT

BACKGROUND OF THE INVENTION

1. Field of the Invention

The present invention relates to a clock regeneration circuit for regenerating duty ratio of a clock pulse to be used in a logic circuit.

2. Prior Art

A prior art clock regeneration circuit will be described with reference to FIGS. 5 and 6. In FIG. 5, denoted at 1 is an input terminal, 4 is a delay circuit, 5 is an output terminal, and 6 is a D-type flip-flop (hereinafter referred to as D-FF). In FIG. 5, data inputted to a data input terminal (hereinafter referred to as D) of the D-FF 6 is fixed to an H level, and an output of the input terminal 1 is inputted to a clock terminal of the D-FF 6. A Q output (hereinafter referred to as Q) of the D-FF 6 is connected to the output terminal 5, and is also connected to a reset terminal (hereinafter referred to as R) of the D-FF 6 by way of the delay circuit 4.

The operation of the conventional clock regeneration circuit in FIG. 5 will be now described with reference to a timing chart of FIG. 6. FIG. 6 (a) shows a waveform of an inputted clock signal a, FIG. 6 (b) shows a waveform of an output b of the D-FF 6, FIG. 2 (c) shows a waveform of an output c of the delay circuit 4. In FIG. 6 (a), when a clock pulse of the input clock signal a is outputted from the input terminal 1 to the clock terminal of the D-FF 6, the output b of the D-FF 6 in FIG. 6 (b) is changed from an L level to an H level after the lapse of an internal delay time $t_1$ required from the time when the input clock signal is inputted to the clock terminal of the D-FF 6 until the time when the output b of the D-FF 6 is outputted from the Q of the D-FF 6 (hereinafter referred to as simply as an interval delay time $t_1$) of the D-FF 6, and is then outputted to the output terminal 5 as an output clock signal b.

At the same time, the output clock signal b is also supplied to the delay circuit 4 wherein the output c of the delay circuit 4 in FIG. 6 (c) is changed from the L level to the H level after the lapse of a delay time $t_2$ of the delay circuit 4, and is then inputted to the R of the D-FF 6. Accordingly, in FIG. 6 (b), the output b of the D-FF 6 is changed to the L level after the lapse of an internal delay time $t_3$ required from the time when the output c of the delay circuit 4 is inputted to the R of the D-FF 6 until the time when the output of the D-FF 6 is outputted from the Q of the D-FF 6 (hereinafter referred to as simply as an internal delay time $t_3$) the and is then outputted to the output terminal 5 as an output clock signal b, and it is simultaneously supplied to the delay circuit 4. The output c of the delay circuit 4 in FIG. 6 (c) is further changed to the L level after the lapse of the delay time $t_2$, then it is inputted to the R of the D-FF 6.

In the conventional clock regeneration circuit having the arrangement as shown in FIG. 5, the time required from the time when the output of the delay circuit 4 is inputted to the R of the D-FF-6 until the time when a succeeding clock pulse is inputted to the clock terminal of the D-FF 6 needs to satisfy a release time $t_{rel}$ of the D-FF 6. However, since the pulse width of the output of the delay circuit 4 (which was inputted to the R of the D-FF 6) is equal to that of the output clock signal b, the maximum value of the pulse width allowed by the output clock signal b is expressed by $(T+t_3-t_1-t_{rel})/2$ supposing that the cycle is T. Accordingly, in the arrangement as shown in FIG. 5, there is a problem in that the pulse width of the output clock signal is further smaller than the duty ratio of 50%. It is therefore an object of the present invention to provide a clock regeneration circuit capable of obtaining clocks having an arbitrary duty.

SUMMARY OF THE INVENTION

To achieve the above object, a clock regeneration circuit can obtain clocks each having an arbitrary duty. A clock regeneration circuit according to a first aspect of the invention comprises a first D-type flip-flop (2) having a clock terminal for receiving an input clock signal (a) from an input terminal (1), and a data input terminal (D) for receiving data of an H level, a second D-type flip-flop (6) having a clock terminal for receiving the input clock signal (a) from the input terminal (1), and a data input terminal (D) for receiving data of an H level, a first delay circuit (3) which receives an output (c) from an output terminal (Q) of the first D-type flip-flop (2) and outputs an output (d) thereof to the reset terminal (R) of the first D-type flip-flop (2), and a second delay circuit (4) which receives the output (c) from an output terminal (Q) of the first D-type flip-flop (2) and outputs an output (e) to a reset terminal (R) of the second D-type flip-flop (6), wherein an output clock signal (b) is outputted from an output terminal (Q) of the second D-type flip-flop (6) to an output terminal (5).

A clock regeneration circuit according to a second aspect of the invention comprises a first D-type flip-flop (2) having a clock terminal for receiving an input clock signal (a) from an input terminal (1), and a data input terminal (D) for receiving data of an H level, a second D-type flip-flop (6) having a clock terminal for receiving the input clock signal (a) from the input terminal (1), and a data input terminal (D) for receiving data of an H level, a first delay circuit (3) which receives an output (c) from an output terminal (Q) of the first D-type flip-flop (2) and outputs an output (d) thereof to the reset terminal (R) of the first D-type flip-flop (2), and a second delay circuit (4) which receiving an output (d) of the first delay circuit (3) and outputs an output (e) to a reset terminal (R) of the second D-type flip-flop (6), wherein an output clock signal is outputted from an output terminal (Q) of the second D-type flip-flop (6) to an output terminal (5).

According to the first aspect of the invention, when the pulse of the input clock signal is inputted to the input terminal 1, the output of the second D-FF 6 is changed from the L level to the H level, and the first D-FF 2 generates a differential pulse. The differential pulse generated by the first D-FF 2 is delayed by the second delay circuit 4 or by the first and second delay circuits 3 and 4 (in the second aspect of the invention), and the thus delayed pulse is inputted to the reset terminal of the second D-FF 6. At this time, when the delayed amount of the second delay circuit 4 is permitted to correspond to a value of the desired duty ratio, it is possible to obtain an output clock signal having an arbitrary duty ratio.

Further, the pulse width to be inputted to the R of the D-FF 6 depends on the delay time of the first delay circuit 3, and hence it may be a value satisfying the minimum pulse width of the differential pulse inputted to the reset terminal of the second D-FF 6, and it is set independently of the pulse width of the output clock signal. Accordingly, there is no problem even if the output clock signal has a large pulse width exceeding the duty ratio of 50%.

BRIEF DESCRIPTION OF THE DRAWINGS

FIG. 3 shows a circuit arrangement of a clock regeneration circuit according to a second embodiment of the invention;

FIG. 4 is a timing chart showing the operation of the clock regeneration circuit in FIG. 3;

FIG. 5 shows a circuit arrangement of a conventional clock regeneration circuit; and FIG. 6 is a timing chart showing the operation of the clock regeneration circuit in FIG. 5.

PREFERRED EMBODIMENT OF THE INVENTION

Figure 1:
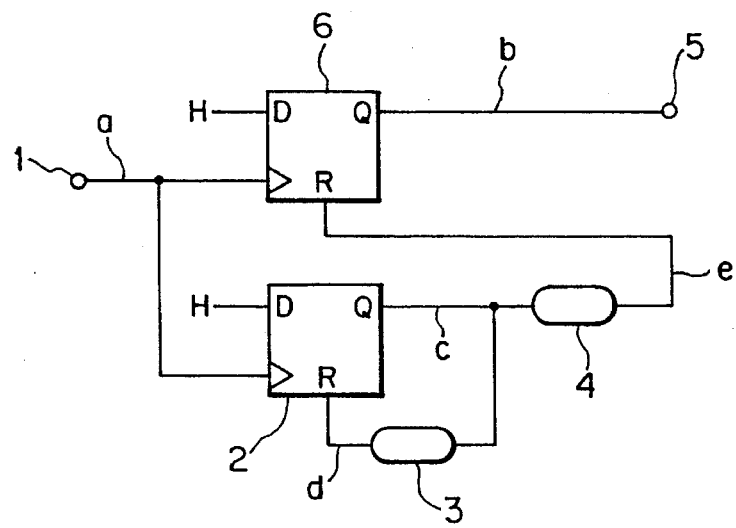
FIG. 1 shows a circuit arrangement of a clock regeneration circuit according to a first embodiment of the invention.
Figure 1:
Figure 2A:
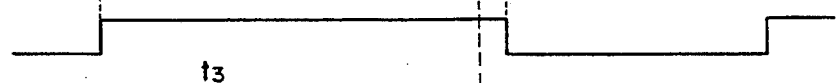
FIG. 2 is a timing chart showing the operation of the clock regeneration circuit in FIG. 1.
Figure 2B:
Figure 2C:
Figure 2D:
Figure 2E:
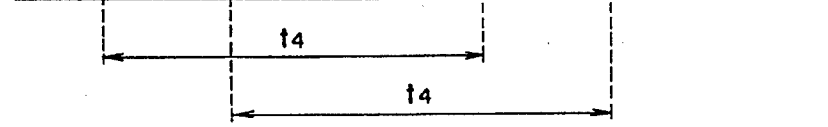

First Embodiment (FIGS. 1 and 2)

FIG. 1 is a circuit arrangement of a clock regeneration circuit according to a first embodiment of the invention.

Denoted at 1 is an input terminal, 2 is a D type flip-flop (hereinafter referred to as a first FF), 3 is a first delay circuit, 4 is a second delay circuit, 5 is an output terminal and 6 is a second D-type flip-flop (hereinafter referred to as a second FF). In FIG. 1, an input clock signal of the input terminal 1 is inputted to clock terminal of the first FF 2 and the second FF 6. Data input terminals of the first and second FFs 2 and 6 are respectively fixed to an H level. An output terminal Q (hereinafter referred to as Q) of the second FF 6 is connected to the output terminal 5. A Q of the first FF 2 is connected to a reset terminal (hereinafter referred to as R) of the second FF 6 by way of the second delay circuit 4 and is also connected to R of the first FF 2 by way of the first delay circuit 3.

The operation of the clock regeneration circuit will be described with reference to a timing chart in FIG. 2. FIG. 2 (a) shows a waveform of an inputted clock signal a, FIG. 2 (b) shows a waveform of an output b of the second FF 6, FIG. 2 (c) shows a waveform of an output c of the first FF 2, FIG. 2 (d) shows a waveform of an output d of the first delay circuit 3, and FIG. 2 (e) shows a waveform of an output e of the second delay circuit 4.

In FIG. 2 (a) when a clock pulse of the input clock signal a is outputted from the input terminal 1 is inputted to the clock terminals of the first and second FFs 2 and 6, the output of the second FF 6 is changed from an L level to an H level after the lapse of the internal delay time $t_1$ required for the clock signal to pass through the D to Q since the data in the D of the second FF 2 is fixed to the H level, and it is outputted to the output terminal 5 as an output clock signal. On the other hand, since the D of the first FF 2 is also fixed to the H level, the output c of the first FF 2 is also changed from the L level to the H level after the lapse of the internal delay time $t_1$ as shown in FIG. 2 (c).

The signal of the first FF 2 which is changed from the L level to the H level is inputted to the first delay circuit 3 and the second delay circuit 4. The output d of the first delay circuit 3 is changed from the L level to the H level after the lapse of the delay time $t_2$ as shown in FIG. 2 (d), and it is supplied to the R of the first FF 2. Accordingly, the output c of the first FF 2 is changed to the L level after the lapse of the internal delay time $t_3$ as shown in FIG. 2 (c). On the other hand, the output of the second delay circuit 4 is changed from the L level to the H level after the lapse of a delay time $t_4$ as shown in FIG. 2 (e) and is inputted to the R of the second FF 6. Then, the output of the second FF 6 is further changed to the L level after the lapse of the delay time $t_3$ as shown in FIG. 2 (b).

The output c of the first FF 2 which was changed to the L level is inputted to the first and second delay circuits 3 and 4. As shown in FIG. 2 (d), the output d of the first delay circuit 3 is changed to the L level after the lapse of the delay time $t_2$ of the first delay circuit 3, and is then supplied to the R of the first FF 2. On the other hand, the output e of the second delay circuit 4 in FIG. 2 (e) is changed to the L level after the lapse of the delay time $t_4$ of the second delay circuit 4, and supplied to the R of the second FF 6.

At this time, the pulse width of the outputted clock signal b becomes $t_4+t_3$. Since the pulse width of the output e of the second delay circuit 4 is equal to that of the first FF 2, namely, equal to $t_2+t_3$, the maximum value of the pulse width allowed by the outputted clock signal b is expressed by $T-t_1-t_{ref}-t_2$, which exceeds 50% in duty ratio.

Second Embodiment (FIGS. 3 and 4)

A clock regeneration circuit according to a second embodiment will be described with reference to FIGS. 3 and 4. Components which are the same as those in the first embodiment are denoted by the same numerals. The second embodiment is different from the first embodiment in connection of the components thereof. That is, an output c outputted from the Q of the first FF 2 is delayed by the first delay circuit 3 and it is further delayed by the second delay circuit 4 which is inputted to the R of the second FF 6.

The operation of the clock regeneration circuit of the second embodiment will be described with reference to a timing chart of FIG. 4. FIG. 4 (a) shows a waveform of an inputted clock signal a, FIG. 4 (b) shows an output b of the second FF 6, FIG. 4 (c) shows a waveform of an output c of the first FF 2, FIG. 4 (d) shows a waveform of an output d of the first delay circuit 3, and FIG. 4 (e) shows a waveform of an output e of the second delay circuit 4. In FIG. 4 (a), when the input clock signal a outputted from the input terminal 1 is inputted to the clock terminals of first FF 2 and second FF 6, the output b of the second FF 6 in FIG. 4 (b) is changed from the L level to the H level after the lapse of internal delay time $t_1$ of the clock signal of the second FF 6 and it is outputted to the output terminal 5 as an output clock signal since the data inputted to the D of the second FF 6 is fixed to the H level.

Meanwhile, since the data inputted to the D of the first FF 2 is fixed to the H level, the output c of the first FF 2 in FIG. 4 (c) is changed from the L level to the H level after the lapse of the internal delay time $t_1$ of the first FF 2, and is then supplied to the first delay circuit 3. The output d of the first delay circuit 3 in FIG. 4 (d) is changed from the L level to the H level after the lapse of the delay time $t_2$ of the first delay circuit 3.

The output d of the first delay circuit 3, which was changed from the L level to the H level, is supplied to the R of the first FF 2 and also to the second delay circuit 4. The output e of the second delay circuit 4 in FIG. 4 (e) is changed from the L level to the H level after the lapse of the delay time $t_4$ of the second delay circuit 4, and is then supplied to the R of the second FF 6.

Accordingly, the output b of the second FF 6 in FIG. 4 (b) is changed to the L level after the lapse of the internal delay time $t_3$ of the second FF 6. On the other hand, the output c of the first FF 2 in FIG. 4 (c) is changed to the L level after the lapse of the internal delay time $t_3$ of the first FF 2, and is then supplied to the first delay circuit 3. Accordingly, the output d of the first delay circuit 3 in FIG. 4 (d) is further changed to the L level after the lapse of the delay time $t_2$ of the first delay circuit 3, and is then supplied to the R of the first FF 2 and to the second delay circuit 4. The output e of the second delay circuit 4 in FIG. 4 (e) is further changed to the L level after the lapse of the delay time $t_4$ of the second delay circuit 4. At this time, the pulse width of the output clock signal b is expressed by $t_2+t_4+t_3$. Since the pulse width of the output e of the second delay circuit 4 is equal to that of the first FF 2, i.e., expressed by $t_2+t_3$, the maximum value of the pulse width allowed by the output clock signal b is expressed by $T-t_1-t_{ref}-t_2$, which exceeds 50% in duty ratio.

The pulse width of the output e of the second delay circuit can be increased as the delay time of the first delay circuit 3 is shorter, and the minimum delay time is equal to the minimum pulse width for resetting the output d of first delay circuit 3 at the R of the first FF 2.

According to the first and second embodiments of the invention, it is possible to output the output clock signal which exceeds 50% in duty ratio by allowing the pulse width of the output signal inputted to the R of the second FF 6, based on which the output clock signal is generated, to be a fixed width not relying on the duty ratio of the output clock signal.

What is claimed is:

1. A clock regeneration circuit comprising:

a first D-type flip-flop having a clock terminal for receiving an input clock signal from an input terminal, and a data input terminal for receiving data of an H level;

a second D-type flip-flop having a clock terminal for receiving the input clock signal from the input terminal, and a data input terminal for receiving data of an H level;

a first delay circuit for receiving an output from an output terminal of the first D-type flip-flop and for outputting an output to a reset terminal of the first D-type flip-flop; and a second delay circuit for receiving the output from the output terminal of the first D-type flip-flop and for outputting an output to a reset terminal of the second D-type flip-flop;

wherein an output clock signal is outputted from an output terminal of the second D-type flip-flop to an output terminal.

2. A clock regeneration circuit comprising:

a first D-type flip-flop having a clock terminal for receiving an input clock signal from an input terminal, and a data input terminal for receiving data of an H level;

a second D-type flip-flop having a clock terminal for receiving the input clock signal from the input terminal, and a data input terminal for receiving data of an H level;

a first delay circuit for receiving an output from an output terminal of the first D-type flip-flop and for outputting an output to a reset terminal of the first D-type flip-flop; and a second delay circuit for receiving an output of the first delay circuit, and for outputting an output thereof to a reset terminal of the second D-type flip-flop;

wherein an output clock signal is outputted from an output terminal of the second D-type flip-flop to an output terminal.

* * * * *